(12) United States Patent
Fehlhaber et al.

(10) Patent No.: US 7,318,993 B2
(45) Date of Patent: Jan. 15, 2008

(54) RESISTLESS LITHOGRAPHY METHOD FOR FABRICATING FINE STRUCTURES

(75) Inventors: Rodger Fehlhaber, München (DE); Helmut Tews, München (DE)

(73) Assignee: Infineon Technologies AG, Munich (DE)

( * ) Notice: Subject to any disclaimer, the term of this patent is extended or adjusted under 35 U.S.C. 154(b) by 563 days.

(21) Appl. No.: 10/499,417

(22) PCT Filed: Dec. 10, 2002

(86) PCT No.: PCT/DE02/04524

§ 371 (c)(1), (2), (4) Date: Dec. 6, 2004

(87) PCT Pub. No.: WO03/056611

PCT Pub. Date: Jul. 10, 2003

(65) Prior Publication Data

US 2005/0106861 A1 May 19, 2005

(30) Foreign Application Priority Data

Dec. 21, 2001 (DE) ................. 101 63 346

(51) Int. Cl.
*G03C 5/00* (2006.01)
(52) U.S. Cl. ............ 430/296; 430/302; 430/314; 430/323; 430/324; 438/551
(58) Field of Classification Search .......... 430/296, 430/302, 314, 323, 324; 438/551
See application file for complete search history.

(56) References Cited

U.S. PATENT DOCUMENTS

| 4,450,041 | A | 5/1984 | Aklufi |
| 4,897,361 | A | 1/1990 | Harriott et al. |
| 4,999,083 | A | 3/1991 | Watanabe et al. |
| 5,106,764 | A | 4/1992 | Harriott et al. |
| 5,918,143 | A | 6/1999 | Beauvais et al. |
| 6,074,930 | A | 6/2000 | Cho et al. |
| 6,177,331 | B1 | 1/2001 | Koga |
| 6,475,919 | B2 | 11/2002 | Brencher et al. |

FOREIGN PATENT DOCUMENTS

| DE | 100 00 003 C2 | 7/2001 |
| EP | 0 321 144 A2 | 6/1989 |
| EP | 0 363 099 A1 | 4/1990 |
| EP | 0 932 187 A2 | 7/1999 |
| JP | 51-019974 | 2/1976 |
| JP | 56-116626 | 9/1981 |
| JP | 63051641 A | 3/1988 |
| JP | 63281488 A | 11/1988 |
| JP | 02-002102 | 1/1990 |
| JP | 02034922 | 2/1990 |
| JP | 02-191326 | 7/1990 |
| JP | 7-162046 | 6/1995 |
| JP | 08-250403 | 9/1996 |
| JP | 10-335444 | 12/1998 |
| JP | 11-204633 | 7/1999 |

OTHER PUBLICATIONS

Brugger, J. et al., "Silicon Micro/Nanomechanical Device Fabrication Based on Focused Ion Beam Surface Modification and KOH Etching", *Microelectronic Engineering*, 35 (1997) pp. 401-404.
Rennon, S. et al., "Nanoscale Patterning By Focused Ion Beam Enhanced Etching For Optoelectronic Device Fabrication", *Microlectronic Engineering* 57-58 (2001) pp. 891-896.
Rensch, David B. et al., Submicrometer FET gate fabrication using resistless and focused ion beam techniques; 8257B *Journal of Vacuum Science & Technology*/B 3 (1985) Jan.-Feb., No. 1 Second Series, Woodbury, NY, USA.
Wolf, Ph.D., Stanley et al., "Silicon Processing For The VLSI Era, vol. 1: Process Technology"; *Lattice Press*, Sunset Beach, California.
International Search Report for Patent Cooperation Treaty application No. PCT/DE02/04524, dated Nov. 1, 3003, 4 pages.

*Primary Examiner*—Christopher G. Young
(74) *Attorney, Agent, or Firm*—Brinks Hofer Gilson & Lione

(57) ABSTRACT

A resistless lithography method for fabricating fine stiuctures is disclosed. IN an embodiment, a semiconductor mask layer (HM) may be formed on a carrier material (TM, HM') and a selective ion implantation (I) being effected in order to dope selected regions (1) of the semiconductor mask layer (HM). Wet chemical removal of the non doped regions of the semiconductor mask layer (HM) yields a semiconductor mask which can be used for further patterning. A simple and high precision resistless lithography method for structures smaller than 100 nm is obtained in this way.

15 Claims, 5 Drawing Sheets

RESISTLESS LITHOGRAPHY METHOD FOR FABRICATING FINE STRUCTURES

PRIORITY AND CROSS REFERENCE TO RELATED APPLICATIONS

This application is related to and claims the benefit of priority under 35 U.S.C. §§ 120, 365, and 371 to Patent Cooperation Treaty patent application no. PCT/DE02/04524, filed on Dec. 10, 2002, which was published at WO 03/056611, in German.

This application is further related to and claims the benefit of priority of Dec. 21, 2001 under 35 U.S.C. § 119 to German patent application no. DE 101 63 346.7, filed on Dec. 21, 2001.

BACKGROUND OF THE INVENTION

1. Technical Field

The present invention generally relates to a resistless lithography method for fabricating fine structures and, in particular, to a resistless lithography method for fabricating sub 100 nm structures in a carrier material or semiconductor material.

2. Related Art

In the development of lithography methods for fabricating fine structures in a sub 100 nm regime, problems may arise from a resist chemistry, the mask fabrication, and the complexity of the lithography system.

A type of lithography referred to as 157 nm lithography has been reached in the further development of optical lithography for fabricating fine structures in a regime smaller than 100 nm. These lithography methods use novel resist materials. However, the existing materials may not satisfy technical requirements with regard to such small structures. These new materials may use new mask fabrication methods and their development may be cost intensive and difficult to handle.

As an alternative to conventional optical lithography methods, a maskless lithography method, (e.g. an electron beam direct write lithography (EBDW)), has been introduced where a suitable resist may be required. A resist may be an organic exposure layer including a polymer.

Other alternatives to exposure are, for example, ion projection lithography (IPL) methods, so called stencil masks being used to image the structures on a special resist material. However, the fabrication of a suitable resist material, in particular, is increasingly restricting the realization of structures that are becoming ever finer.

BRIEF SUMMARY

The above problems have been solved with the present invention. By way of introduction only, the present invention may provide a resistless lithography method for fabricating fine structures. By forming a hard mask layer as the topmost layer of a carrier material, the hard mask layer having a TEOS, SiO2, nitride, SiC or BPSG layer, for example, an undesirable doping of underlying regions can be prevented. As a result, electrical properties of semiconductor elements remain generally unaffected.

The semiconductor mask layer may include an amorphous silicon semiconductor layer, resulting in the precise formation of fine structures. It is also possible to use polycrystalline or crystalline semiconductor layers for the semiconductor mask layer.

A further improvement in the structure precision results when using undoped or weakly p doped semiconductor material for the semiconductor mask layer, the thickness being between 10 nm and 20 nm.

During the exposure of the semiconductor mask layer which replaces the resist, an ion implantation may be carried out perpendicularly and realization of very fine structures may be obtained in conjunction with very thin layers.

By way of example, a direct lithographic writing with a focused ion beam, an ion beam lithography with a programmable mask, or an ion beam lithography with a projection mask can be carried out for the selective ion implantation. In each case, optimized exposure methods or ion beam methods can be used depending on the desired structure. It may also be possible to effectively fabricate both very fine structures in a semiconductor circuit and stencil masks or projection masks with fine structures. It is also possible to realize micromechanical components other desired surface effects on semiconductor materials, in which case the selective ion implantation for doping semiconductor regions and the wet chemical removal of the doped or non doped semiconductor regions can be effected directly in a semiconductor material or in a semiconductor wafer.

The foregoing discussion of the summary is provided only by way of introduction. Other systems, methods, processes, apparatuses, features and advantages of the invention will be, or will become, apparent to one with skill in the art upon examination of the following figures and detailed description. It is intended that all such additional systems, methods, features and advantages be included within this description, be within the scope of the invention, and may be realized and obtained by means of the instrumentalities and combinations particularly pointed out in the claims.

BRIEF DESCRIPTION OF THE DRAWINGS

This invention can be better understood with reference to the following drawings and description. The components in the figures are not necessarily to scale, emphasis instead being placed upon illustrating the principles of the invention. Moreover, in the figures, like referenced numerals designate corresponding parts throughout the different views.

DETAILED DESCRIPTION OF THE PREFERRED EMBODIMENTS

Figure 1A:
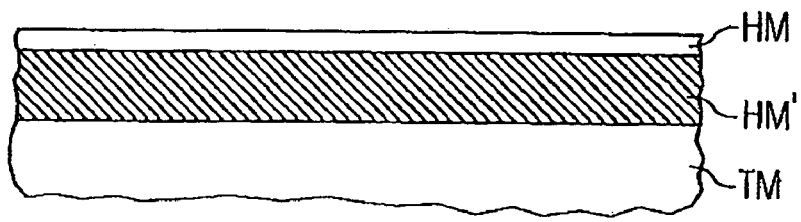
FIGS. 1A to 1E illustrate sectional views for a first exemplary embodiment of resistless lithography.
Figure 1B:
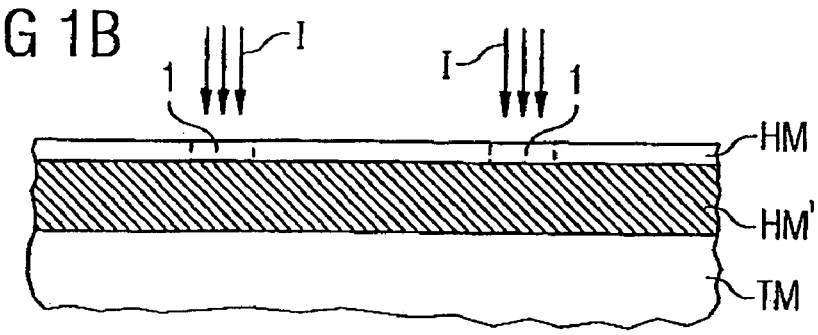
Figure 1C:
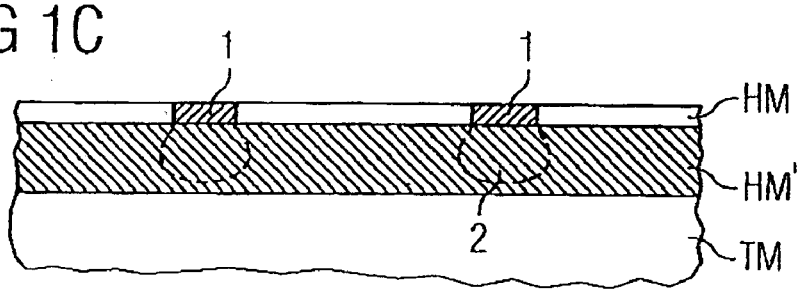
Figure 1D:
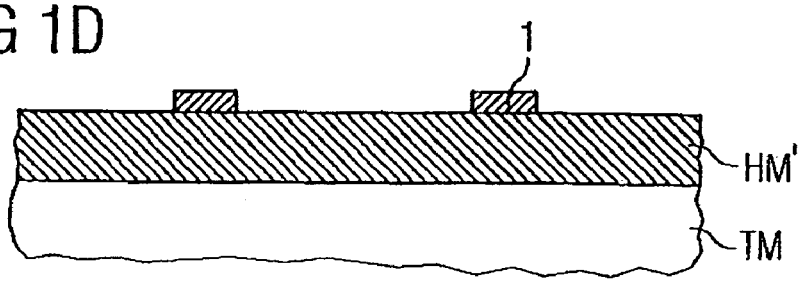
Figure 1E:
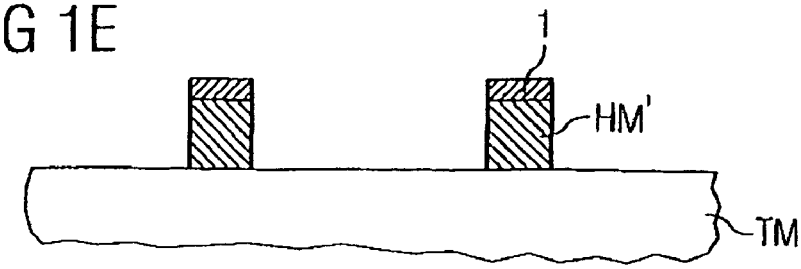

Exemplary embodiments of the invention are illustrated in the drawings and explained in more detail in the description below.

FIGS. 1A to 1E show simplified sectional views of fabrication steps of a resistless lithography method in accordance with a first exemplary embodiment. In the embodiment illustrated in FIG. 1A, after an optional planarization step for leveling a topology of a carrier material TM, a thin hard mask layer HM' is formed. The carrier material TM may be an Si wafer or Si semiconductor wafer, for example, in which case it is also possible to use all further carrier materials and, in particular, semiconductor materials such as III-V materials, for example.

By way of example, a TEOS, SiO$_2$, nitride, SiC or BPSG layer is formed as the hard mask layer HM' or topmost layer of the carrier material. It is also possible to use further hard mask layers which are adapted to a respective standard method or a respective carrier material TM.

In accordance with FIG. 1A, as the topmost layer, a semiconductor mask layer HM may be formed on the carrier material or the hard mask layer HM', preferably a thin amorphous semiconductor layer such as e.g. a silicon semiconductor layer with a thickness of 10 nm to 20 nm being deposited at a temperature of 500 to 600 degrees Celsius. It is also possible to use other methods for forming the semiconductor mask layer and, in particular, other semiconductor materials can thus be produced. In particular, the interaction of the perpendicular implantation with a small layer thickness of the semiconductor mask layer HM and the energies mentioned above makes it possible to lithographically fabricate fine structures not previously achieved.

The above described p-type doping may be effected in an undoped or weakly p-doped semiconductor mask layer HM. However, n-type dopings in an undoped or weakly n-doped semiconductor mask layer HM or opposite dopings for doping the semiconductor mask layer HM are also possible.

Different types of focused ion beam methods are possible for the above described direct writing to the semiconductor mask layer HM.

By way of example, in a single source—single beam method, a single ion beam can be generated by means of a single ion source and be used for writing to the semiconductor mask layer. Furthermore, a single source—multiple beam method is also possible, however, in which a multiple of ion beams are generated by means of a single ion source and in turn used to write to the semiconductor mask layer. As another alternative for this local ion implantation method using a focused beam, it is possible to use a multi-source single beam method in which a multiplicity of ion sources may be used to generate a single ion beam that is used for writing parallel to the semiconductor mask layer. Furthermore, it is possible to use the multi-source multibeam method, in which multiple ion sources are used to generate a multiple of ion beams that write parallel to the semiconductor mask layer HM.

Figure 2A:
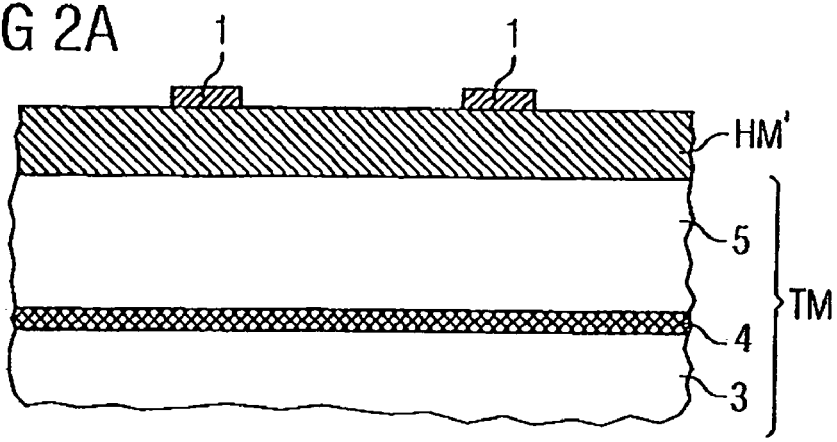
FIGS. 2A to 2D illustrate sectional views for a second exemplary embodiment of resistless lithography.
Figure 2B:
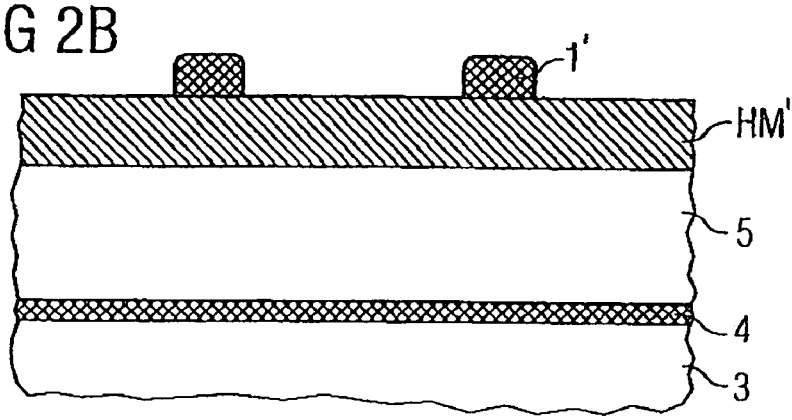
Figure 2C:
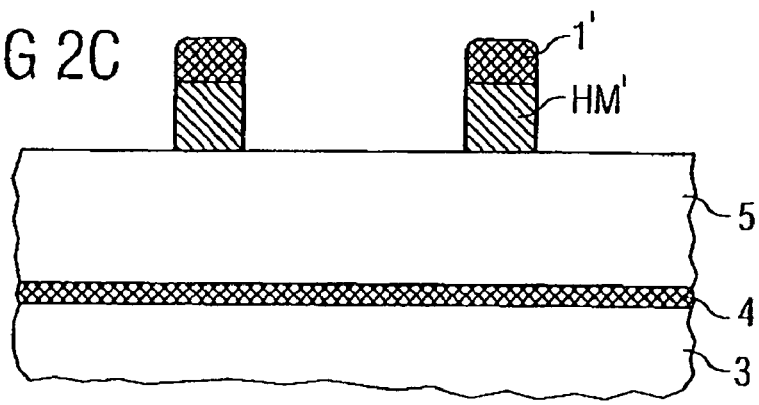
Figure 2D:
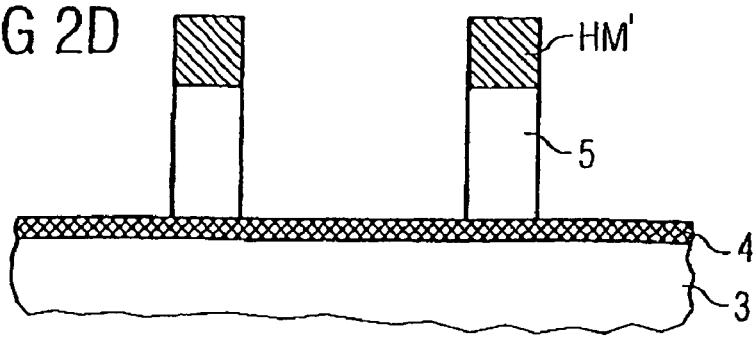

In accordance with FIG. 2D, the oxide mask or the oxidized regions 1' are removed and an anisotropic etching method (e.g. reactive ion etching (RIE)) is carried out for etching the polysilicon layer S selectively with respect to the hard mask layer HM', as a result, the gate structure illustrated in FIG. 2D may be obtained.

In semiconductor circuits arbitrarily small structures can be fabricated in a freely selectable manner, i.e. lithographically, in which case the structures can also lie very close together. Moreover, this resistless lithography method enables a fast and clean patterning. In particular, when using focused ion beams, there is a decrease in a so called exposure time, and thus, the fabrication time for the fine structures with the decreasing size of the structures to be formed. This constitutes an essential advantage with respect to conventional methods.

However, the method described above can be used not only as a lithography method for fabricating fine structures in semiconductor circuits but also, by way of example, for fabricating fine structures in projection masks or so called stencil masks.

FIG. 3 shows a simplified sectional view of a fabrication step in a resistless lithography method in accordance with a third exemplary embodiment.

In accordance with the resistless lithography methods illustrated in FIGS. 1 and 2, selected regions 1 may be doped more precisely in different planes and an extraordinarily precise semiconductor mask can thus be provided.

The invention has been described above on the basis of silicon semiconductor layers. However, it is not restricted thereto and encompasses alternative materials in the same way. In the same way, structures other than gate structures can also be fabricated in semiconductor circuits. Likewise, in addition to boron or BF$_2$ implantation and NH$_4$OH etching, alternative ion beams and likewise alternative wet chemical etching methods are also possible.

Figure 3A:
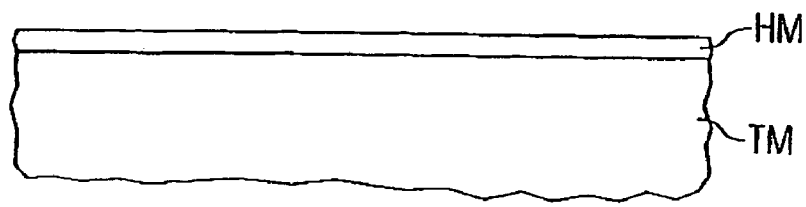
FIG. 3 illustrate sectional view for a third exemplary embodiment of resistless lithography.

In accordance with FIG. 3A, for the fabrication of a projection mask or a so called stencil mask, a semiconductor wafer thinned to 100 nm can be used, by way of example, as, the carrier material TM. In accordance with the steps described above, this semiconductor wafer or the carrier material TM is coated with a semiconductor mask layer HM and doped perpendicularly at selected regions in accordance with the selective ion implantation methods described above, thereby producing the sectional view illustrated in FIG. 3B.

Figure 3B:
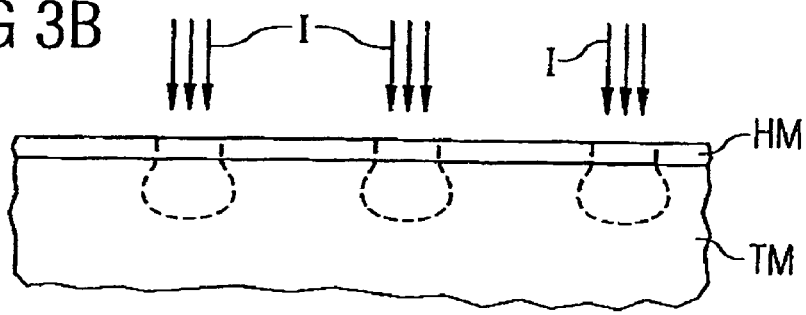
Figure 3C:
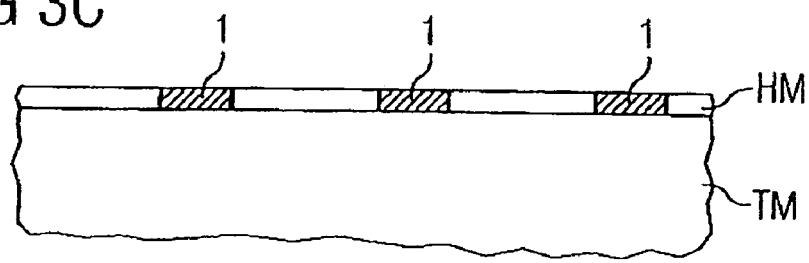
Figure 3D:
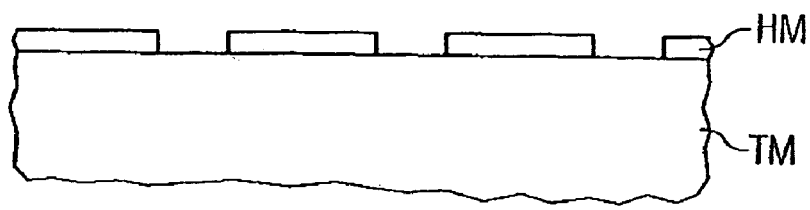
Figure 3E:
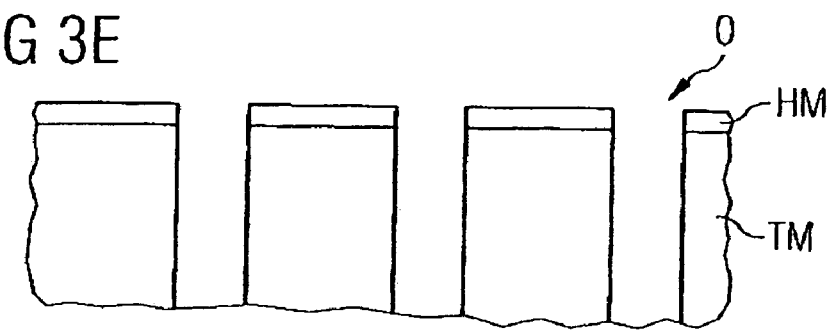

In accordance with FIGS. 3C and 3D, the doped or nondoped regions 1 of the semiconductor mask layer HM are removed, after the implantation I, by means of the wet chemical etching method described above and, in accordance with FIG. 3E, transferred to the carrier material or the thinned semiconductor wafer TM, thereby producing-continuous openings O. Projection masks or so called stencil masks can be formed very simply in this way and with fine structures not known hitherto.

The implantation regions illustrated by broken lines in FIG. 3B, in particular in the carrier material TM, are not of importance in this case since no active components have to be formed in such projection masks.

However, the resistless lithography described above is suitable not only for the fabrication of fine structures in projection masks and semiconductor circuits, but also for the fabrication of, for example, very small micromechanical components or for surface processing.

FIGS. 4A to 4D show simplified sectional views for illustrating fabrication steps of a resistless lithography method in accordance with a fourth exemplary embodiment of this type.

Figure 4A:
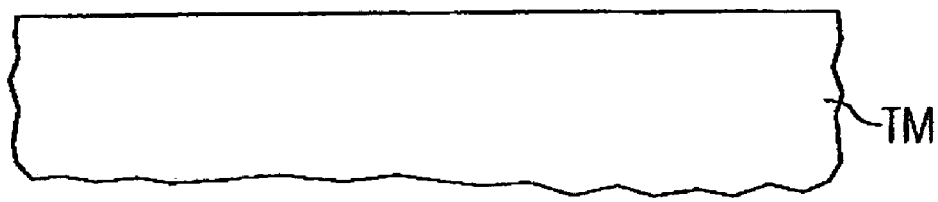
FIGS. 4A to 4D illustrate sectional views for a fourth exemplary embodiment of resistless lithography.

In accordance with FIG. 4A, for the realization of such surface structures or micromechanical components, the carrier material TM used may be a semiconductor material, which is again amorphous, polycrystalline or crystalline.

Figure 4B:
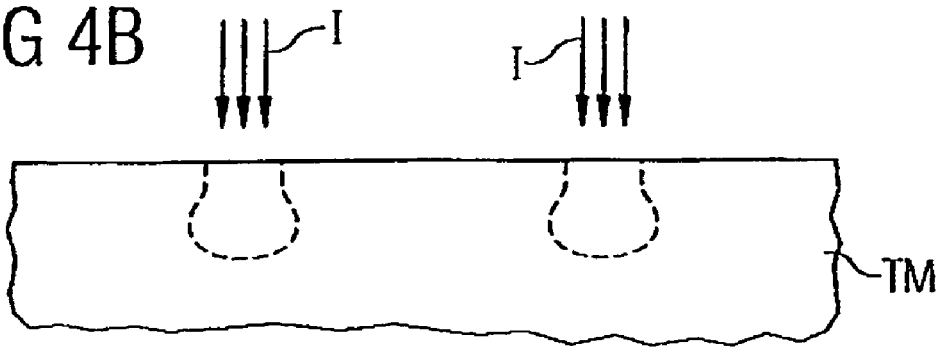

Once again, in accordance with FIG. 4B, a selective perpendicular implantation I is carried out in order to dope selected regions 1 of the semiconductor material or carrier material TM, a repeated description being dispensed with at this juncture and reference being made to the respective methods of the first exemplary embodiment.

Figure 4C:
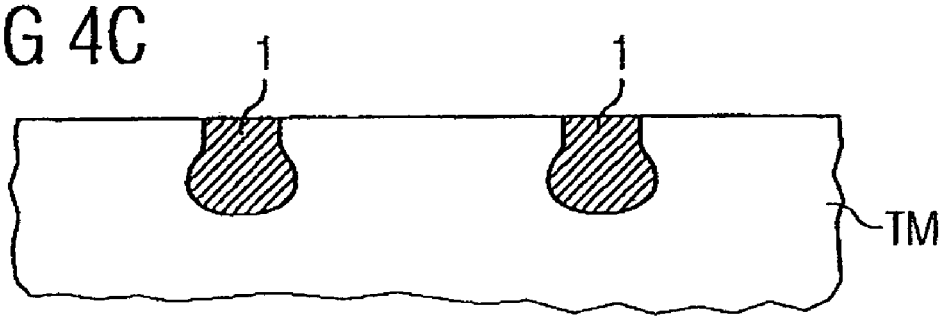
Figure 4D:
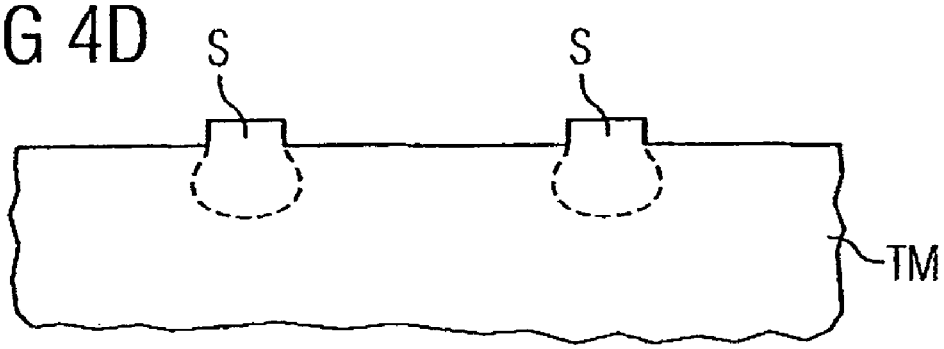

In accordance with FIG. 4C, a selected region 1 is thus doped in the semiconductor material or carrier material TM, which region is used for fabricating a step form S, for example, once again by means of the wet chemical etching methods already described. The wet chemical etching may be similar to that described above. Fine structures in the range of less than 100 nm can be formed in a semiconductor material. In the same way, it is thereby possible to process surfaces and establish corresponding roughnesses in a targeted manner.

Figure 5:
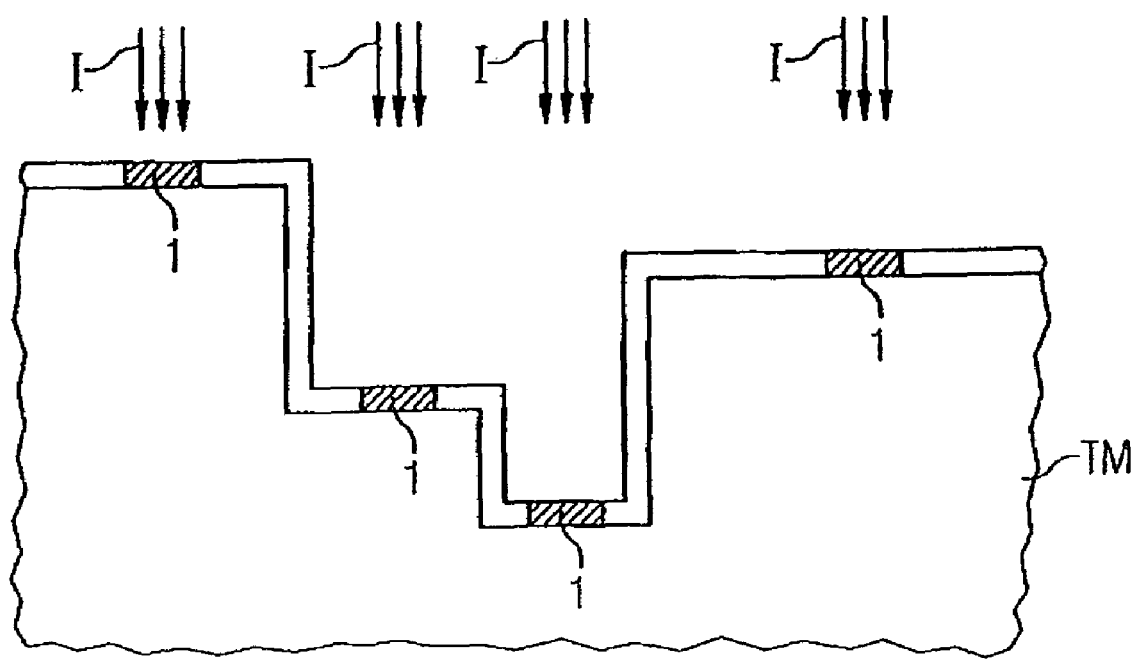
FIG. 5 illustrates a sectional view for a fifth exemplary embodiment in resistless lithography.

FIG. 5 shows a simplified sectional view of an fabrication step in a resistless lithography method in accordance with a fifth exemplary embodiment, identical reference symbols again designating identical layers or elements and a repeated description of these elements and of the associated method steps being dispensed with below.

In accordance with the resistless lithography methods illustrated in FIGS. 1 to 4, selected regions 1 can now be doped very exactly even in different planes and an extraordinarily precise semiconductor mask can thus be provided.

The invention has been described above on the basis of silicon semiconductor layers. However, it is not restricted thereto and encompasses alternative materials in the same way. In the same way, structures other than gate structures can also be fabricated in semiconductor circuits. Likewise, in addition to boron or $BF_2$ implantation and $NH_4OH$ etching, alternative ion beams and likewise alternative wet chemical etching methods are also possible.

While the above embodiments have been described, those skilled in the art will recognize that the advantages may be extended to various semiconductors and various processes. Accordingly, the invention is not to be restricted except in light as necessitated by the accompanying claims and their equivalents.

The invention claimed is:

1. Resistless lithography method for fabricating fine structures in a carrier material, comprising the steps of:
  a) preparing the carrier material (TM, HM'), a hard mask layer (HM') being formed as the topmost layer of the carrier material (TM);
  b) forming a semiconductor mask layer (HM) on the carrier material (TM, HM');
  c) doping selected regions of the semi-conductor mask layer (HM) with a selective ion implantation (I);
  d) removing at least a doped region (1) of the semiconductor mask layer (HM) with a wet chemical removal to form a semiconductor mask; and
  e) patterning the carrier material (TM, HM') using the patterned semi-conductor mask.

2. The method of claim 1, wherein the hard mask layer (HM') comprises any of a TEOS, SiO2, nitride, SiC or BPSG layer.

3. The method of claim 1, wherein step a) comprises planarizing the carrier material (TM, HM').

4. The method of claim 1 wherein step b) comprises forming any of an amorphous layer, polycrystalline layer and crystalline semiconductor layer.

5. The method of claim 1 wherein step b) comprises forming any of an undoped semiconductor layer and a weakly p-doped semiconductor layer.

6. The method of claim 1 wherein step b) comprises forming the semiconductor mask layer (HM) having a thickness of about 10 nm to about 20 nm.

7. The method of claim 1 wherein ion implantation (I) is effected substantially perpendicular to the semiconductor mask layer (HM).

8. The method of claim 1 wherein step c) comprises performing a direct lithographic writing with a focused ion beam.

9. The method of claim 8, wherein the focused beam comprises any of a single source—single beam, a single source—multiple beam, a multisource—single beam and a multisource—multibeam method.

10. The method of claim 1 wherein step c) comprises performing an ion beam lithography with a programmable mask.

11. The method of claim 1 wherein step c) comprises performing an ion beam lithography with a projection mask.

12. The method of claims 1 wherein step c) comprises an implantation energy of 1 keV–10 keV and an implantation dose of 1E13 $cm^{-2}$ to 5E14 $cm^{-2}$ are used.

13. The method claim 1 wherein step c) comprises a p type doping having a dopant concentration greater than about 1E19 atoms/$cm^3$.

14. The method of claim 1 wherein step b) comprises forming undoped semiconductor material as a semiconductor mask layer, and step d) comprises an $NH_4OH$ wet etching for removing undoped regions of the semiconductor mask layer (HM) with a selectivity of grater than about 100.

15. The method of claim 14 wherein step e) comprises an anisotropic etching.

* * * * *

UNITED STATES PATENT AND TRADEMARK OFFICE
CERTIFICATE OF CORRECTION

| | | |
|---|---|---|
| PATENT NO. | : 7,318,993 B2 | Page 1 of 1 |
| APPLICATION NO. | : 10/499417 | |
| DATED | : January 15, 2008 | |
| INVENTOR(S) | : Rodger Fehlhaber et al. | |

It is certified that error appears in the above-identified patent and that said Letters Patent is hereby corrected as shown below:

On the Title Page,

Item (56), line 7, under "OTHER PUBLICATIONS", immediately before "Submicrometer FET gate" insert --"--.

Item (56), line 8, under "OTHER PUBLICATIONS", immediately after "beam techniques" insert --"--.

Column 6, in claim 12, line 1, after "method of" delete "claims" and substitute --claim-- in its place.

Column 6, in claim 13, line 1, after "The method" insert --of--.

Column 6, in claim 14, line 5, after "with a selectivity of" delete "grater" and substitute --greater-- in its place.

Signed and Sealed this

Twenty-fourth Day of June, 2008

JON W. DUDAS
*Director of the United States Patent and Trademark Office*